(12) United States Patent
Wang

(10) Patent No.: US 11,441,595 B2
(45) Date of Patent: Sep. 13, 2022

(54) METHOD OF ASSEMBLING FASTENER STRUCTURE ON PLATE BODY

(71) Applicant: FIVETECH TECHNOLOGY INC., New Taipei (TW)

(72) Inventor: Ting-Jui Wang, New Taipei (TW)

(73) Assignee: FIVETECH TECHNOLOGY INC., New Taipei (TW)

( * ) Notice: Subject to any disclaimer, the term of this patent is extended or adjusted under 35 U.S.C. 154(b) by 0 days.

(21) Appl. No.: 17/069,897

(22) Filed: Oct. 14, 2020

(65) Prior Publication Data
US 2021/0025438 A1    Jan. 28, 2021

Related U.S. Application Data

(63) Continuation-in-part of application No. 16/396,860, filed on Apr. 29, 2019.

(30) Foreign Application Priority Data

May 4, 2018   (TW) .................................. 107115334

(51) Int. Cl.
*B23P 19/02* (2006.01)
*F16B 41/00* (2006.01)
*B25J 15/06* (2006.01)
*F16B 5/02* (2006.01)

(52) U.S. Cl.
CPC ......... *F16B 41/002* (2013.01); *B25J 15/0608* (2013.01); *B25J 15/0616* (2013.01); *F16B 5/0208* (2013.01); *F16B 5/0266* (2013.01); *Y10T 29/49945* (2015.01)

(58) Field of Classification Search
CPC . B25B 23/1456; B25B 11/002; F16B 5/0208; F16B 21/02; F16B 35/005; F16B 5/0266; F16B 5/0642; Y10T 29/49128; Y10T 29/49963; Y10T 29/49945; Y10T 29/49948; Y10T 29/49826; H05K 2201/1031; H05K 2201/10409; H05K 2201/2036
USPC ...... 29/525, 281.1, 428, 525.02, 564.7, 825, 29/831, 832
See application file for complete search history.

(56) References Cited

U.S. PATENT DOCUMENTS

2021/0010498 A1\* 1/2021 Wang ........................ F16B 5/08

\* cited by examiner

*Primary Examiner* — Thiem D Phan
(74) *Attorney, Agent, or Firm* — Schmeiser, Olsen & Watts, LLP

(57) ABSTRACT

A method of assembling a fastener structure on a plate body is introduced. The fastener structure includes a body portion and a fastening body. The body portion has a solderable layer, and the solderable layer is soldered to a plate body. The fastening body combines movably with the body portion. The fastening body has a head and a fastening portion. The body portion or the fastening body is provided on the plate body for soldering after it is picked up by a tool so that the body portion can combine with the plate body. Also, the body portion or the fastening body combines with an assisting pickup unit, and the fastener structure is provided on the plate body for soldering after it is picked up by a tool through the assisting pickup unit so that the body portion can combine with the plate body.

29 Claims, 15 Drawing Sheets

122

(a)     (b)     (c)     (d)

METHOD OF ASSEMBLING FASTENER STRUCTURE ON PLATE BODY

CROSS-REFERENCE TO RELATED APPLICATION

This application is a continuation-in-part patent application of U.S. application Ser. No. 16/396,860 filed on Apr. 29, 2019, which claims priority to Taiwanese Patent Application No. 107115334 filed on May 4, 2018, the entire contents both of which are hereby incorporated by reference.

BACKGROUND OF THE INVENTION

1. Field of the Invention

The present disclosure relates to a method of assembling a fastener structure on a plate body, and in particular to a method which can assemble a fastener structure on a plate body rapidly.

2. Description of the Related Art

When two plate bodies are combined, the two plate bodies are generally fastened by screws that they are not easy to separate. Accordingly, the two plate bodies are combined firmly that can be assured, and the separation from each other is not easy to happen.

However, in terms of the above-mentioned common way, although it can combine two plate bodies that they are not easy to separate, the screws cannot rapidly assemble and fasten with one of the plate bodies.

Thus, it is desirable to have a method of assembling a fastener structure on a plate body, which is expected to achieve the purpose of assembling a fastener structure on a plate body rapidly that is to be actively disclosed by the invention.

BRIEF SUMMARY OF THE INVENTION

In view of the shortcomings of the above-mentioned prior art, the inventor felt that it was not perfect, and exhausted his mind to research carefully into a way for overcoming the problems, and then developed a method of assembling a fastener structure on a plate body. It is expected to achieve the purpose of assembling a fastener structure on a plate body rapidly.

To achieve at least the above objective, the present disclosure provides a fastener structure, comprising: a body portion and a fastening body. The body portion has a solderable layer, and the solderable layer is used to be soldered to a plate body. The fastening body combines movably with the body portion. The fastening body has a head and a fastening portion.

The invention further provides a fastener structure, comprising: a body portion and a fastening body. The body portion has a solderable layer, and the solderable layer is used to be soldered to a plate body. The fastening body combines movably with the body portion. The fastening body has a head and a fastening portion. The body portion or the fastening body, or both the body portion and the fastening body is (are) provided on the plate body for soldering after it is (they are) picked up by a tool so that the body portion can combine with the plate body.

The invention further provides a fastener structure, comprising: a body portion and a fastening body. The body portion has a solderable layer, and the solderable layer is used to be soldered to a plate body. The fastening body combines movably with the body portion. The fastening body has a head and a fastening portion. The body portion or the fastening body, or both the body portion and the fastening body combine(s) with an assisting pickup unit, and the fastener structure is provided on the plate body for soldering after it is picked up by a tool through the assisting pickup unit so that the body portion can combine with the plate body.

In an embodiment, the fastening portion is a thread body, a protrusion fastening body, an inner fastening body or a column.

In an embodiment, the fastener structure further comprises an elastic element, and two ends of the elastic element abut respectively against the body portion and the fastening body.

In an embodiment, the plate body has at least one opening thereon, and the body portion is provided in the opening or out of the opening.

In an embodiment, the plate body is a PCB having a corresponding solderable layer.

In an embodiment, the fastener structure is loaded in a carrier, and the fastener structure is taken out from the carrier for use by a tool.

In an embodiment, the carrier has a cover, and the cover can prevent the fastener structure loaded in the carrier from displacement and separation in a process of movement.

In an embodiment, the carrier has a bevel portion or step portion, and the bevel portion or step portion is used to limit or stably carry the body portion or the fastening body of the fastener structure in the carrier.

In an embodiment, the carrier is a stock coil or stock tray.

In an embodiment, the carrier or the bevel portion or step portion of the carrier has a safety distance accommodating space for accommodating a protrusion portion or drooping portion of the head or the fastening portion of the fastening body.

In an embodiment, the safety distance accommodating space can prevent the head or the fastening portion from the interference of the carrier, or makes a relative distance of the head or the fastening portion with the body portion controlled by the interference stop of the carrier.

In an embodiment, the assisting pickup unit is a plug or cap, and the assisting pickup unit may fit to the body portion, the fastening portion or the head, or simultaneously fit to the body portion and the fastening portion, or simultaneously fit to the body portion and the head.

In an embodiment, the body portion has a stuck portion, and the assisting pickup unit has a corresponding stuck portion, and the corresponding stuck portion can fit to the stuck portion each other.

In an embodiment, the stuck portion or the corresponding stuck portion is a bevel, curved surface, arc surface, convex portion, concave portion, step portion or plane portion.

In an embodiment, the body portion has an assisting mounting portion for entering the body portion into an opening of the plate body.

In an embodiment, the assisting mounting portion is a bevel, curved surface, arc surface, convex portion, concave portion, step portion or plane portion.

In an embodiment, the body portion has an assisting mounting portion for entering the body portion into an opening of the plate body, or for combining the assisting pickup unit with the body portion.

In an embodiment, the assisting pickup unit is a sheet with viscosity so that the assisting pickup unit may stick on a surface of the body portion, a surface of the fastening portion or a surface of the head, or simultaneously stick on a surface of the body portion and a surface of the fastening portion, or simultaneously stick on a surface of the body portion and a surface of the head.

In an embodiment, the solderable layer of the body portion is soldered to a corresponding solderable layer of the plate body during the heating process.

In an embodiment, the solderable layer or the corresponding solderable layer is tin, copper, nickel or zinc.

In an embodiment, the body portion has a shoulder or a combination portion, and the shoulder or the combination portion can abut against the plate body, or is provided on a surface or the opening of the plate body.

In an embodiment, the assisting pickup unit is a sheet, fastening body, plug, convex body, concave body, curved surface body, step portion body, bevel body, plane body, pore body, groove body or arc surface body.

In an embodiment, the assisting pickup unit is a polyester film, plastic film, plastic material body, polymer body, plastic body, rubber body, silicone rubber body or metallic body.

In an embodiment, the body portion has a resistant portion, and the resistant portion resists movably with the fastening portion or the head.

In an embodiment, the tool is a vacuum extractor, a fixture or a magnetic body.

In an embodiment, an end of the head or the body portion used to combine with the plate body is smaller than an opening of the plate body so that the end of the head is provided through the opening of the plate body or the end of the body portion combines with the opening of the plate body.

In an embodiment, when the fastener structure is picked up by the tool, a device is provided correspondingly or in a corresponding direction in front of placing the fastener structure, and the device is used to calculate the relative position of the body portion or the fastening body with the plate body or an opening of the plate body, or the relative position of the body portion and the fastening body with the plate body or an opening of the plate body, or the relative position of the assisting pickup unit with the plate body or an opening of the plate body to precisely place the fastener structure on the plate body or the opening of the plate body.

In an embodiment, the device is an image matching device, a structural analysis device, a distance calculating device or a relative position correction regulating device.

In an embodiment, the head is larger than an opening of the plate body, and the end of the body portion used to combine the plate body is larger than or smaller than the opening, when combining, the position of the head is in another direction of the combining direction, and the end of the body portion contacts the plate body first to combine with the plate body or an opening of the plate body.

The invention further provides a method of assembling a fastener structure on a plate body, in which the fastener structure has a body portion and a fastening body, the fastening body combines movably with the body portion, and the fastening body has a head and a fastening portion, the method comprises the following steps: providing a tool to pick up the fastener structure; using the tool to move the fastener structure to a preset height over an assembly position of the plate body; and loosening or releasing the fastener structure from the tool to make the fastener structure fall to the assembly position of the plate body.

In an embodiment, the method further comprises the following steps: providing a matching device to match an assembly position or an assembly distance of the fastener structure to the plate body after the tool picking up the fastener structure; using the tool to move the fastener structure to a preset height over the assembly position of the plate body according to matching information of the matching device; and loosening or releasing the fastener structure from the tool to make the fastener structure fall to the assembly position of the plate body.

In an embodiment, the method further comprises the following steps: providing a matching device to match a position or distance of the fastener structure to a corresponding solderable layer on the assembly position of the plate body after the tool picking up the fastener structure; using the tool to move the fastener structure to a preset height over the corresponding solderable layer of the plate body according to matching information of the matching device; and loosening or releasing the fastener structure from the tool to make the fastener structure fall to the corresponding solderable layer of the plate body.

In an embodiment, the body portion has a solderable layer, the plate body is a PCB, and the plate body has a corresponding solderable layer, the method further comprises the following steps: providing a matching device to match a position or distance of the fastener structure to the corresponding solderable layer on the assembly position of the plate body after the tool picking up the fastener structure; using the tool to move the fastener structure to a preset height over the corresponding solderable layer of the plate body according to matching information of the matching device; loosening or releasing the fastener structure from the tool to make the fastener structure fall to the corresponding solderable layer of the plate body; and heating and soldering the solderable layer of the fastener structure and the corresponding solderable layer of the plate body.

In an embodiment, the body portion of the fastener structure has a stock accommodating space, and the assembly position of the plate body has an opening, after the stock accommodating space of the fastener structure falls to the opening of the plate body, the fastener structure can be pressed by an external force, the body portion will press around the opening so that the material of the plate body flows into or enters the stock accommodating space.

In an embodiment, the body portion of the fastener structure has an expansion joint, and the assembly position of the plate body has an opening, after the expansion joint of the fastener structure falls to the opening of the plate body, the expansion joint can be pressed by an external force to deform the expansion joint for connecting around the opening.

In an embodiment, the body portion of the fastener structure has a fastening joint, and the assembly position of the plate body has an opening, after the fastening joint of the fastener structure falls to the opening of the plate body, the fastening joint fastens around the opening.

In an embodiment, the fastening joint fastens a fastening body, and then provided around the opening.

In an embodiment, the body portion of the fastener structure has a locking joint, and the assembly position of the plate body has an opening, after the locking joint of the fastener structure falls to the opening of the plate body, the locking joint locks around the opening.

In an embodiment, the locking joint locks a locking body, and then provided around the opening.

In an embodiment, the tool is a vacuum extracting device, fixture, fastening body, magnetic device or robotic arm.

In an embodiment, the corresponding solderable layer is a layer of tin, copper, nickel or zinc.

In an embodiment, the solderable layer is a layer of tin, copper, nickel or zinc.

In an embodiment, the corresponding solderable layer is a copper plating layer, and a tin plating layer is provided on the copper plating layer.

In an embodiment, the solderable layer is a copper plating layer, and a tin plating layer is provided on the copper plating layer.

In an embodiment, the matching device is a visual matching device, a distance matching device, a charge coupled device (CCD) or an image matching device.

In an embodiment, the fastener structure is picked up from a carrier by the tool.

In an embodiment, the preset height is 0.000001 mm to 10 mm.

To achieve at least the above objective, the present disclosure provides a method of assembling a fastener structure on a plate body, which can rapidly assemble the fastener structure on the plate body.

DETAILED DESCRIPTION OF THE INVETION

To facilitate understanding of the object, characteristics and effects of this present disclosure, embodiments together with the attached drawings for the detailed description of the present disclosure are provided.

Figure 1:
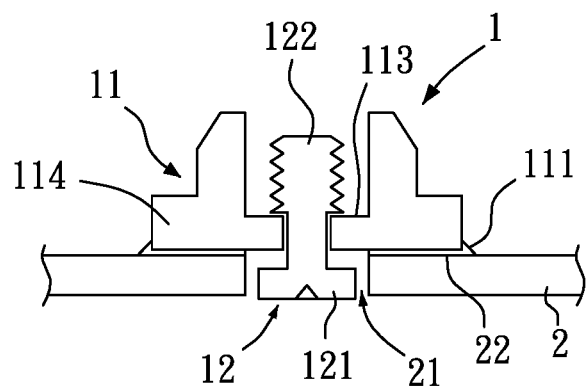
FIG. 1 is a schematic view of sectional state illustrating a fastener structure according to the first embodiment of the present disclosure.

Referring to FIG. 1, as shown in the drawing, the invention provides a fastener structure 1 comprising a body portion 11 and a fastening body 12.

The body portion 11 has a solderable layer 111. The solderable layer 111 is used to be soldered to a plate body 2.

The fastening body 12 combines movably with the body portion 11. The fastening body 12 has a head 121 and a fastening portion 122.

When the fastener structure 1 is used, the fastener structure 1 can be combined on the plate body 2 with the solderable layer 111 of the body portion 11, and another plate body (not shown in the drawings) is provided on the body portion 11, and then the head 121 of the fastening body 12 is rotated to make the fastening portion 122 of the fastening body 12 combine with another plate body (or an object as needed) so that the plate body 2 can combine with the another plate body by the fastener structure 1.

When removing the another plate body is needed, the head 121 of the fastening body 12 is rotated reversely to make the fastening portion 122 of the fastening body 12 move away from another plate body so that the plate body 2 can separate from the another plate body.

In an embodiment of the invention, the plate body 2 has at least one opening 21 thereon, the body portion 11 is provided in the opening 21 (or out of the opening 21). Accordingly, the body portion 11 of the invention can adapt to the need of practical assembly.

In an embodiment of the invention, the solderable layer 111 of the body portion 11 is soldered to a corresponding solderable layer 22 of the plate body 2 during the heating process, and the solderable layer 111 and the corresponding solderable layer 22 may be tin, copper, nickel or zinc. The plate body 2 is a PCB having the corresponding solderable layer 22. Accordingly, the solderable layer 111 can be utilized to cooperate with the corresponding solderable layer 22 so that the body portion 11 can combine with the plate body 2 firmly.

In an embodiment of the invention, an end of the head 121 or the body portion 11 used to combine with the plate body 2 is smaller than the opening 21 of the plate body 2 so that the end of the head 121 is provided through the opening 21 of the plate body 2 or the end of the body portion 11 combines with the opening 21 of the plate body 2. Accordingly, the invention can further meet the requirement of practical assembly.

In an embodiment of the invention, the body portion 11 has a resistant portion 113, and the resistant portion 113 resists movably with the fastening portion 122 (or the head 121). Accordingly, the position of the fastening portion 122 can be limited to prevent the body portion 11 from separating from the fastening portion 122.

In an embodiment of the invention, the body portion 11 has a shoulder 114, and the shoulder 114 can abut against a surface of the plate body 2 or is provided in the opening 21 of the plate body 2. Accordingly, the body portion 11 can be provided on the plate body 2 firmly.

Figure 2:
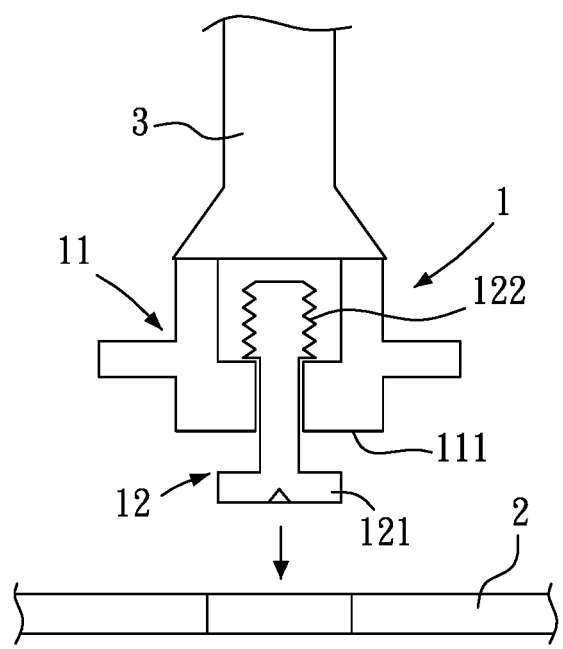
FIG. 2 is a schematic view of state of use illustrating a fastener structure according to the second embodiment of the present disclosure.

Referring to FIG. 2, as shown in the drawing, in the embodiment, the body portion 11 of the fastener structure 1 is provided with a solderable layer 111 that is used for soldering to a plate body 2. The fastening body 12 combines movably with the body portion 11. The fastening body 12 has a head 121 and a fastening portion 122. The body portion 11 or the fastening body 12, or both the body portion 11 and the fastening body 12 is (are) provided on the plate body 2 for soldering after it is (they are) picked up by a tool 3 so that the body portion 11 can combine with the plate body 2. The tool 3 is a vacuum extractor, a fixture or a magnetic body. Accordingly, the fastener structure 1 of the invention can be picked up by a tool 3, and can meet the requirement of practical application.

Figure 3:
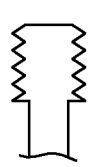
FIG. 3 is a schematic view of different type of a fastening portion of the present disclosure.
Figure 3:
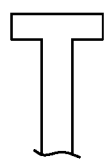
Figure 3:
Figure 3:
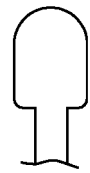

Referring to FIG. 3, as shown in the drawing, in the embodiment, the fastening portion 122 may be a thread body (shown as a portion of FIG. 3), a protrusion fastening body (shown as b portion of FIG. 3), an inner fastening body (shown as c portion of FIG. 3) or a column (shown as d portion of FIG. 3). An action of the fastening portion 122 combining with another plate body (or an object as needed) is performed. Accordingly, the fastening portion 122 of the invention can further meet the requirement of practical application.

Figure 4:
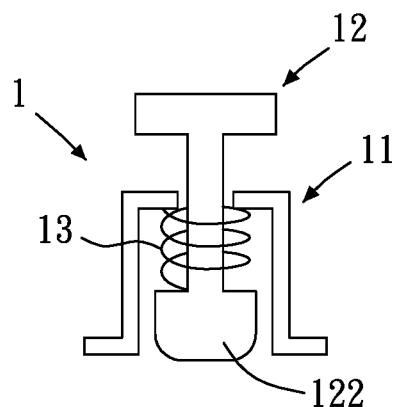
FIG. 4 is a schematic view of sectional state illustrating a fastener structure according to the third embodiment of the present disclosure.

Referring to FIG. 4, as shown in the drawing, in the embodiment, the fastener structure 1 further comprises an elastic element 13 which is provided on the fastening body 12, and two ends of the elastic element 13 abut respectively against the body portion 11 and the fastening portion 122 of the fastening body 12, so that the fastening body 12 has a tightening effect during fastening. Accordingly, the invention can further meet the requirement of practical application.

Figure 5:
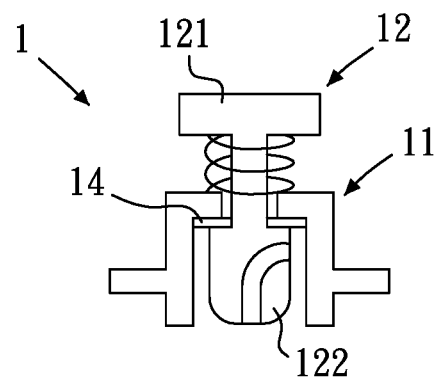
FIG. 5 is a schematic view of sectional state illustrating a fastener structure according to the fourth embodiment of the present disclosure.

Referring to FIG. 5, as shown in the drawing, in the embodiment, the fastener structure 1 further comprises an elastic element 13 which is provided on the fastening body 12, and two ends of the elastic element 13 abut respectively against the body portion 11 and the head 121 of the fastening body 12, and a stopper 14 is provided between the fastening portion 122 and the body portion 11 so that the fastening body 12 has a tightening effect during fastening. Accordingly, the invention can further meet the requirement of practical application.

Figure 6:
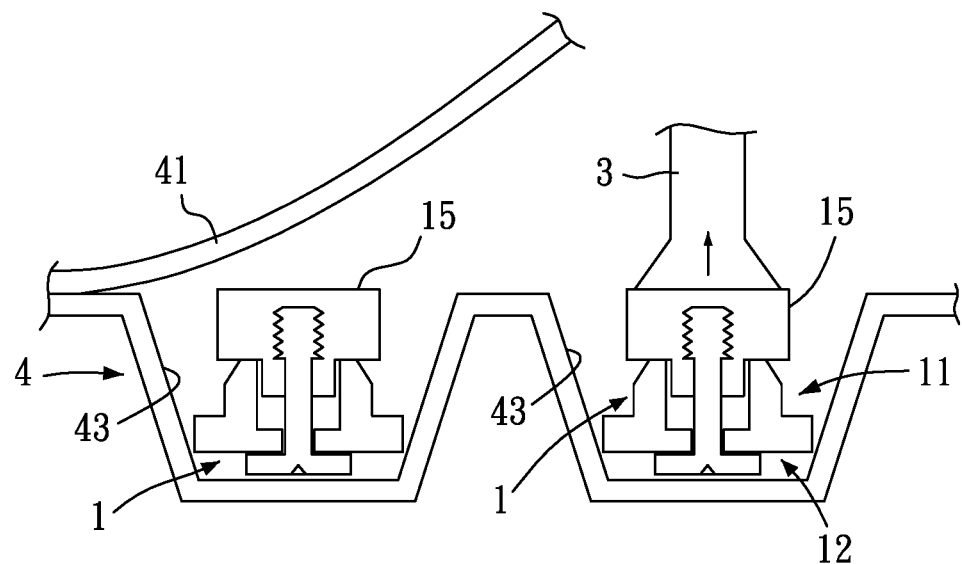
FIG. 6 is a schematic view of sectional state illustrating a fastener structure according to the fifth embodiment of the present disclosure.
Figure 7:
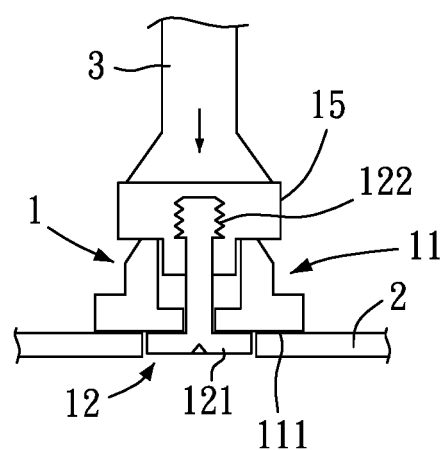
FIG. 7 is a schematic view 1 of state of use illustrating a fastener structure according to the fifth embodiment of the present disclosure.
Figure 8:
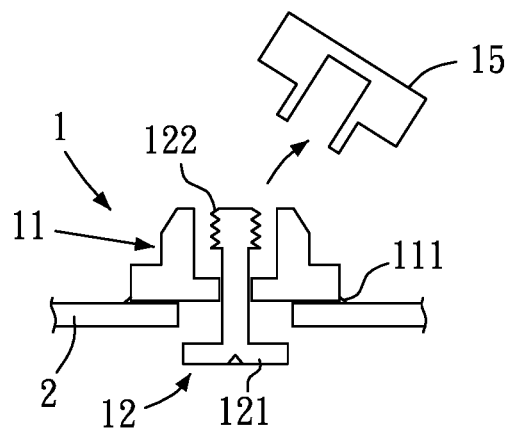
FIG. 8 is a schematic view 2 of state of use illustrating a fastener structure according to the fifth embodiment of the present disclosure.

Referring to FIGS. 6-8, as shown in the drawings, the body portion 11 of the fastener structure 1 is provided with a solderable layer 111 that is used for soldering to a plate body 2 in the embodiment. The fastening body 12 combines movably with the body portion 11. The fastening body 12 has a head 121 and a fastening portion 122. The body portion 11 or the fastening body 12, or both the body portion 11 and the fastening body 12 combine(s) with an assisting pickup unit 15, and the fastener structure 1 is provided on the plate body 2 for soldering after it is picked up by a tool 3 through the assisting pickup unit 15 so that the body portion 11 can combine with the plate body 2.

In an embodiment of the invention, the fastener structure 1 is loaded in a carrier 4, and the fastener structure 1 is taken out from the carrier 4 for use by the tool 3. Also, the carrier 4 has a cover 41, and the cover 41 can prevent the fastener structure 1 loaded in the carrier 4 from displacement and separation in a process of movement. In addition, the carrier 4 has a bevel portion 43 which is used to limit or stably carry the body portion 11 or the fastening body 12 of the fastener structure 1 in the carrier 4.

In an embodiment of the invention, the assisting pickup unit 15 is a plug. The assisting pickup unit 15 may fit to the body portion 11, the fastening portion 122 or the head 121, or simultaneously fit to the body portion 11 and the fastening portion 122, or simultaneously fit to the body portion 11 and the head 121. Also, the assisting pickup unit 15 is removed after the body portion 11 combines with the plate body 2 by soldering.

In an embodiment of the invention, the assisting pickup unit 15 may be a sheet, fastening body, plug, convex body, concave body, curved surface body, step portion body, bevel body, plane body, pore body, groove body or arc surface body. Also, the assisting pickup unit 15 may be a polyester film, plastic film, plastic material body, polymer body, plastic body, rubber body, silicone rubber body or metallic body.

Figure 9:
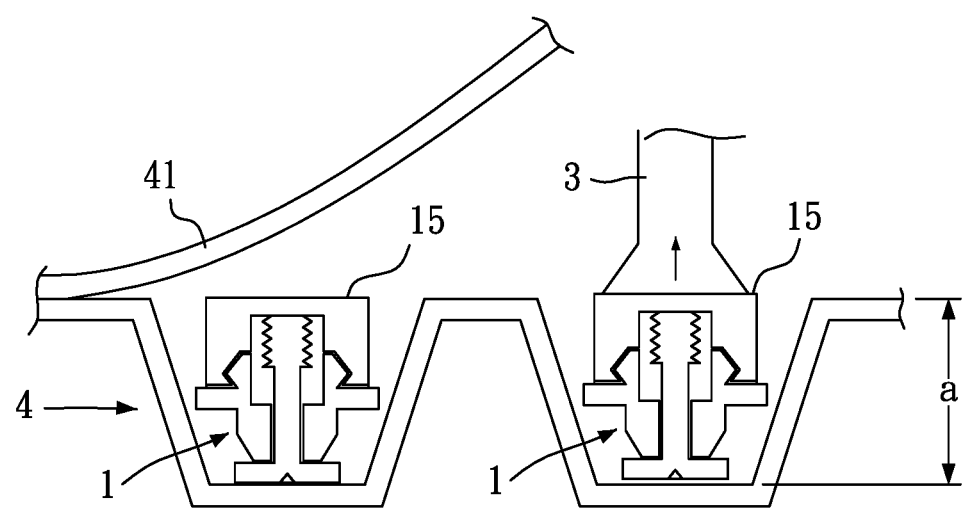
FIG. 9 is a schematic view of sectional state illustrating a fastener structure according to the sixth embodiment of the present disclosure.
Figure 10:
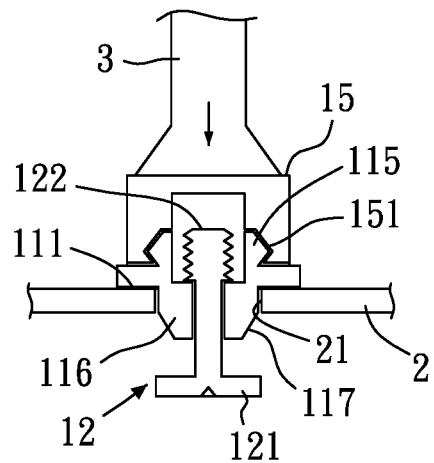
FIG. 10 is a schematic view 1 of state of use illustrating a fastener structure according to the sixth embodiment of the present disclosure.
Figure 11:
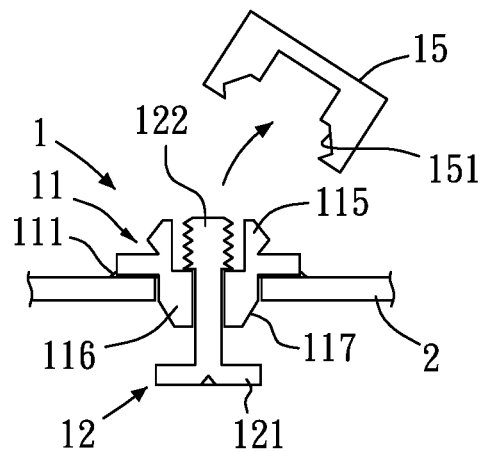
FIG. 11 is a schematic view 2 of state of use illustrating a fastener structure according to the sixth embodiment of the present disclosure.

Referring to FIGS. 9-11, as shown in the drawings, the assisting pickup unit 15 of the fastener structure 1 is a cap in the embodiment. The assisting pickup unit 15 may fit to the body portion 11, the fastening portion 122 or the head 121, or simultaneously fit to the body portion 11 and the fastening portion 122, or simultaneously fit to the body portion 11 and the head 121, so that the fastener structure 1 is taken out from the carrier 4 by the tool 3, and soldering to the plate body 2 by the solderable layer 111. Also, the assisting pickup unit 15 is removed after the body portion 11 combines with the plate body 2 by soldering. The carrier 4 has a safety distance accommodating space a for accommodating a protrusion portion or drooping portion of the head 121 or the fastening portion 122 of the fastening body 12.

In an embodiment of the invention, the body portion 11 has a stuck portion 115. The assisting pickup unit 15 has a corresponding stuck portion 151, and the corresponding stuck portion 151 can fit to the stuck portion 115 each other. The stuck portion 115 and the corresponding stuck portion 151 may be a bevel, curved surface, arc surface, convex portion, concave portion, step portion or plane portion.

In an embodiment of the invention, the body portion 11 has a combination portion 116 for abutting against a surface of the plate body 2 or an opening 21 of the plate body 2, and the combination portion 116 of the body portion 11 has an assisting mounting portion 117 for entering the body portion 11 into the opening 21 of the plate body 2, or for combining the assisting pickup unit 15 with the body portion 11. The assisting mounting portion 117 may be a bevel, curved surface, arc surface, convex portion, concave portion, step portion or plane portion.

Figure 12:
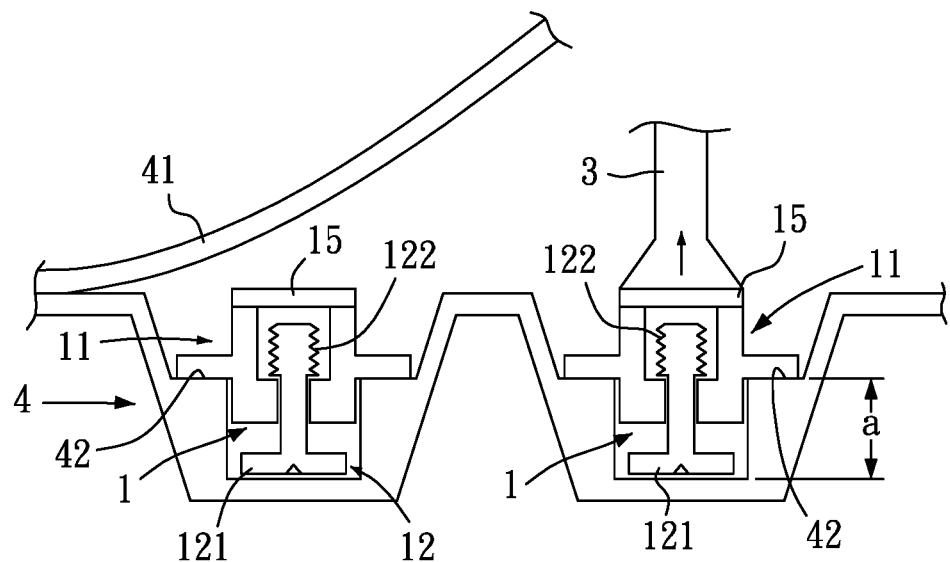
FIG. 12 is schematic view of sectional state illustrating a fastener structure according to the seventh embodiment of the present disclosure.
Figure 13:
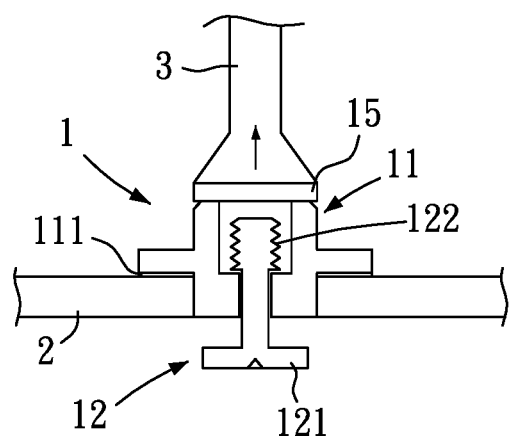
FIG. 13 is a schematic view 1 of state of use illustrating a fastener structure according to the seventh embodiment of the present disclosure.
Figure 14:
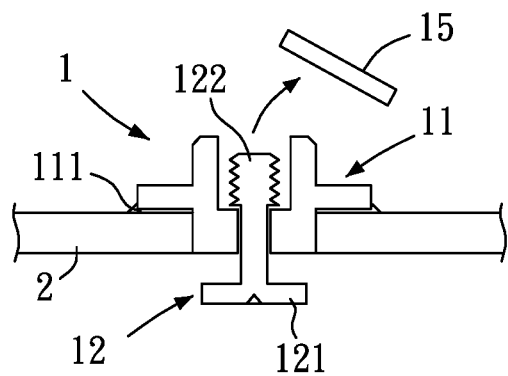
FIG. 14 is a schematic view 2 of state of use illustrating a fastener structure according to the seventh embodiment of the present disclosure.

Referring to FIGS. 12-14, as shown in the drawings, the carrier 4 has a step portion 42, and the step portion 42 is used to limit or stably carry the body portion 11 or the fastening body 12 of the fastener structure 1 in the carrier 4 in the embodiment. Also, the step portion 42 of the carrier 4 has a safety distance accommodating space a for accommodating a protrusion portion or drooping portion of the head 121 or the fastening portion 122 of the fastening body 12. The safety distance accommodating space a can prevent the head 121 or the fastening portion 122 from the interference of the carrier 4, or makes a relative distance of the head 121 or the fastening portion 122 with the body portion 11 controlled by the interference stop of the carrier 4.

In an embodiment of the invention, the assisting pickup unit 15 may be a sheet with viscosity so that the assisting pickup unit 15 may stick on a surface of the body portion 11, a surface of the fastening portion 122 or a surface of the head 121, or simultaneously stick on a surface of the body portion 11 and a surface of the fastening portion 122, or simultaneously stick on a surface of the body portion 11 and a surface of the head 121 so that the fastener structure 1 is taken out from the carrier 4 by the tool 3, and soldering to the plate body 2 by the solderable layer 111. Also, the assisting pickup unit 15 is removed after the body portion 11 combines with the plate body 2 by soldering.

Figures 15, 16:
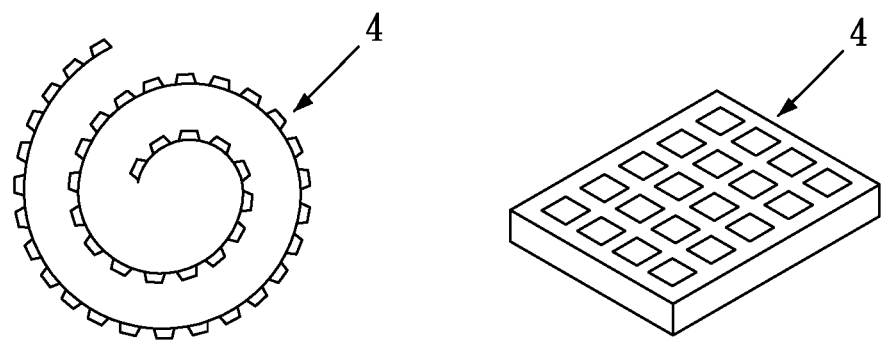
FIG. 15 is a schematic view illustrating a fastener structure according to the eighth embodiment of the present disclosure.
FIG. 16 is a schematic view illustrating a fastener structure according to the ninth embodiment of the present disclosure.

Referring to FIGS. 15-16, as shown in the drawings, the carrier 4 is a stock coil (as shown in FIG. 15) or stock tray (as shown in FIG. 16) in the embodiment. Accordingly, the carrier 4 can further meet the requirement of practical application.

Figure 17:
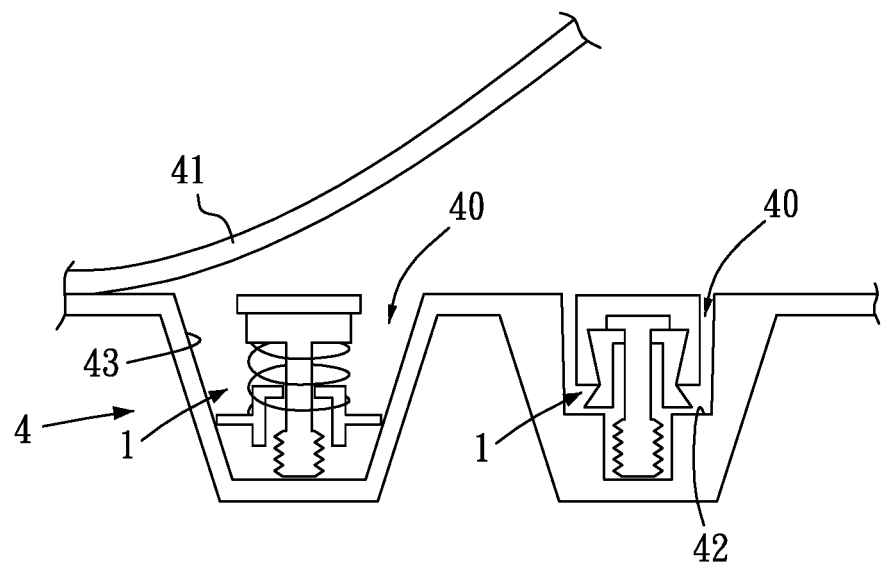
FIG. 17 is a schematic view of sectional state illustrating a fastener structure according to the tenth embodiment of the present disclosure.

Referring to FIG. 17, as shown in the drawing, in the embodiment, the carrier 4 can provide with a step portion 42 in a placement area 40, and a bevel portion 43 in another placement area 40. Accordingly, when the carrier 4 carries the fastener structure 1, the carrier 4 can further meet the requirement of practical application.

Figure 18:
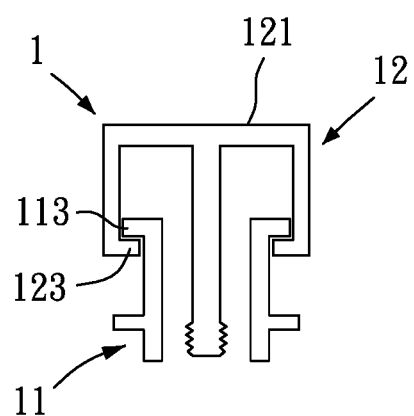
FIG. 18 is a schematic view of sectional state illustrating a fastener structure according to the eleventh embodiment of the present disclosure.
Figure 19:
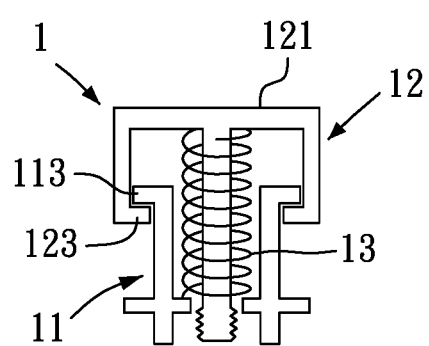
FIG. 19 is a schematic view of sectional state illustrating a fastener structure according to the twelfth embodiment of the present disclosure.

Referring to FIGS. 18-19, as shown in the drawings, in the embodiment, the body portion 11 of the fastener structure 1 has a resistant portion 113, the head 121 of the fastening body 12 has a corresponding resistant portion 123, and the resistant portion 113 resists movably with the corresponding resistant portion 123 (as shown in FIG. 18). In addition, the fastener structure 1 further comprises an elastic element 13 which is provided on the fastening body 12, and two ends of the elastic element 13 abut respectively against the body portion 11 and the fastening portion 122 of the fastening body 12 (as shown in FIG. 19). Accordingly, the fastener structure 1 can further meet the requirement of practical application.

Figure 20:
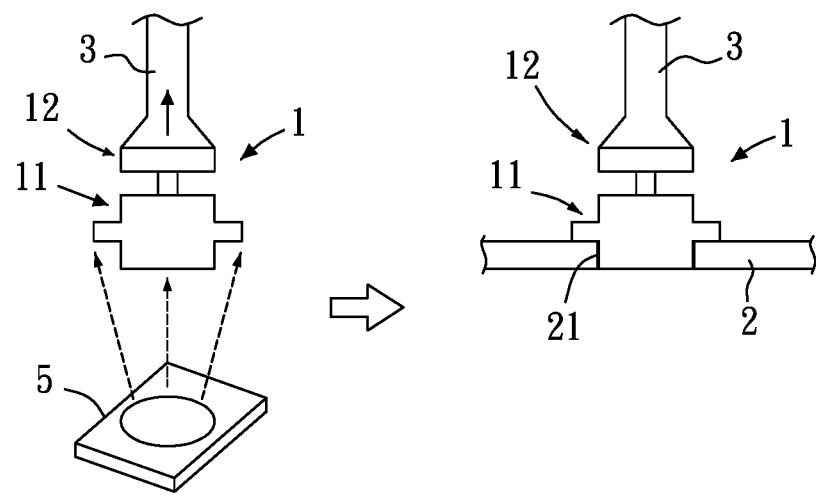
FIG. 20 is a schematic view of state of use illustrating a fastener structure according to the thirteenth embodiment of the present disclosure.
Figure 21:
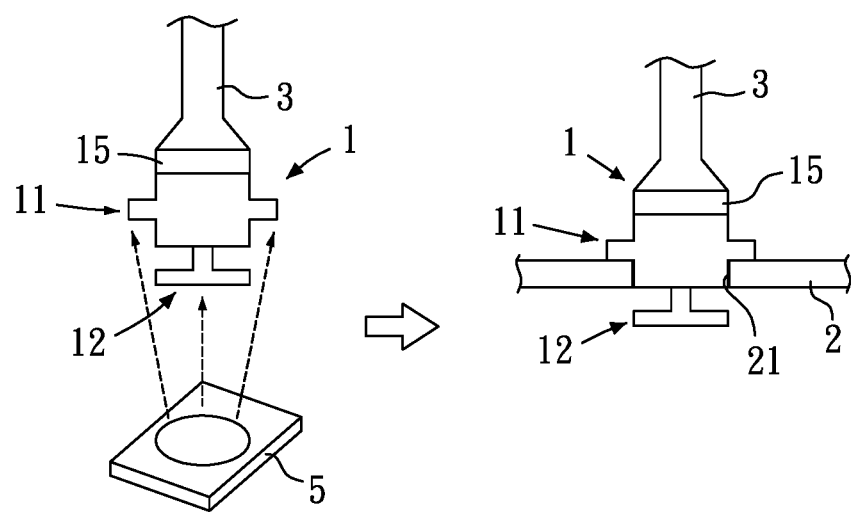
FIG. 21 is a schematic view of state of use illustrating a fastener structure according to the fourteenth embodiment of the present disclosure.

Referring to FIGS. 20-21, as shown in the drawings, when the fastener structure 1 is picked up by the tool 3, a device 5 is provided correspondingly or in a corresponding direction in front of placing the fastener structure 1, and the device 5 is used to calculate the relative position of the body portion 11 or the fastening body 12 with the plate body 2 or an opening 21 of the plate body 2, or the relative position of the body portion 11 and the fastening body 12 with the plate body 2 or an opening 21 of the plate body 2, or the relative position of the assisting pickup unit 15 with the plate body 2 or an opening 21 of the plate body 2, or the relative position of the assisting pickup unit 15 with an opening 21 of the plate body 2 to precisely place the fastener structure 1 on the plate body 2 or the opening 21 of the plate body 2. Accordingly, the fastener structure 1 and the plate body 2 can further meet the requirement of practical application.

Furthermore, the device 5 is an image matching device, a structural analysis device, a distance calculating device or a relative position correction regulating device. Accordingly, the device 5 can adapt to the different use and the need of operation.

Figure 22:
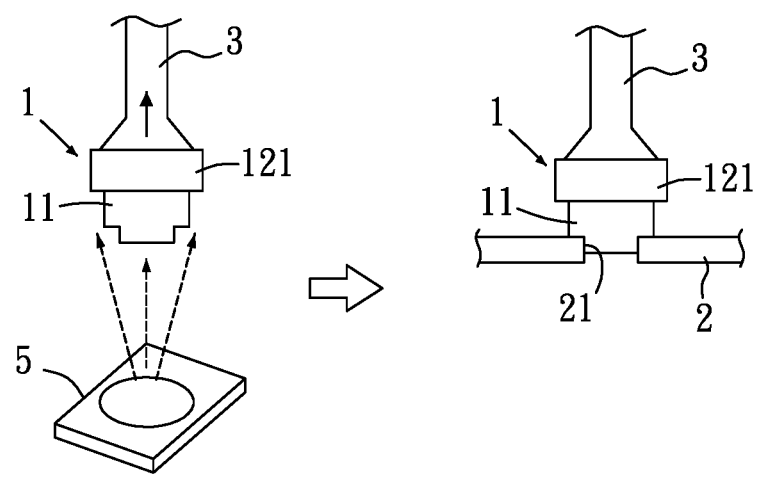
FIG. 22 is a schematic view of state of use illustrating a fastener structure according to the fifteenth embodiment of the present disclosure.

Referring to FIG. 22, as shown in the drawing, the head 121 is larger than an opening 21 of the plate body 2, and the end of the body portion 11 used to combine the plate body 2 is larger than (or smaller than) the opening 21 in the embodiment. When combining, the fastener structure 1 is picked up from the head 121 by the tool 3, a device 5 is provided correspondingly or in a corresponding direction in front of placing the fastener structure 1, and the device 5 is used to calculate the relative distance of the body portion 11 or the fastening body 12 with the plate body 2 or an opening 21 of the plate body 2, or the relative distance of the body portion 11 and the fastening body 12 with the plate body 2 or an opening 21 of the plate body 2. Also, the position of the head 121 is in another direction of the combining direction, and the end of the body portion 11 contacts the plate body 2 first to combine with the plate body 2 or an opening 21 of the plate body 2. Accordingly, when the fastener structure 1 combines with the plate body 2, they can further meet the requirement of practical application.

Figure 23:
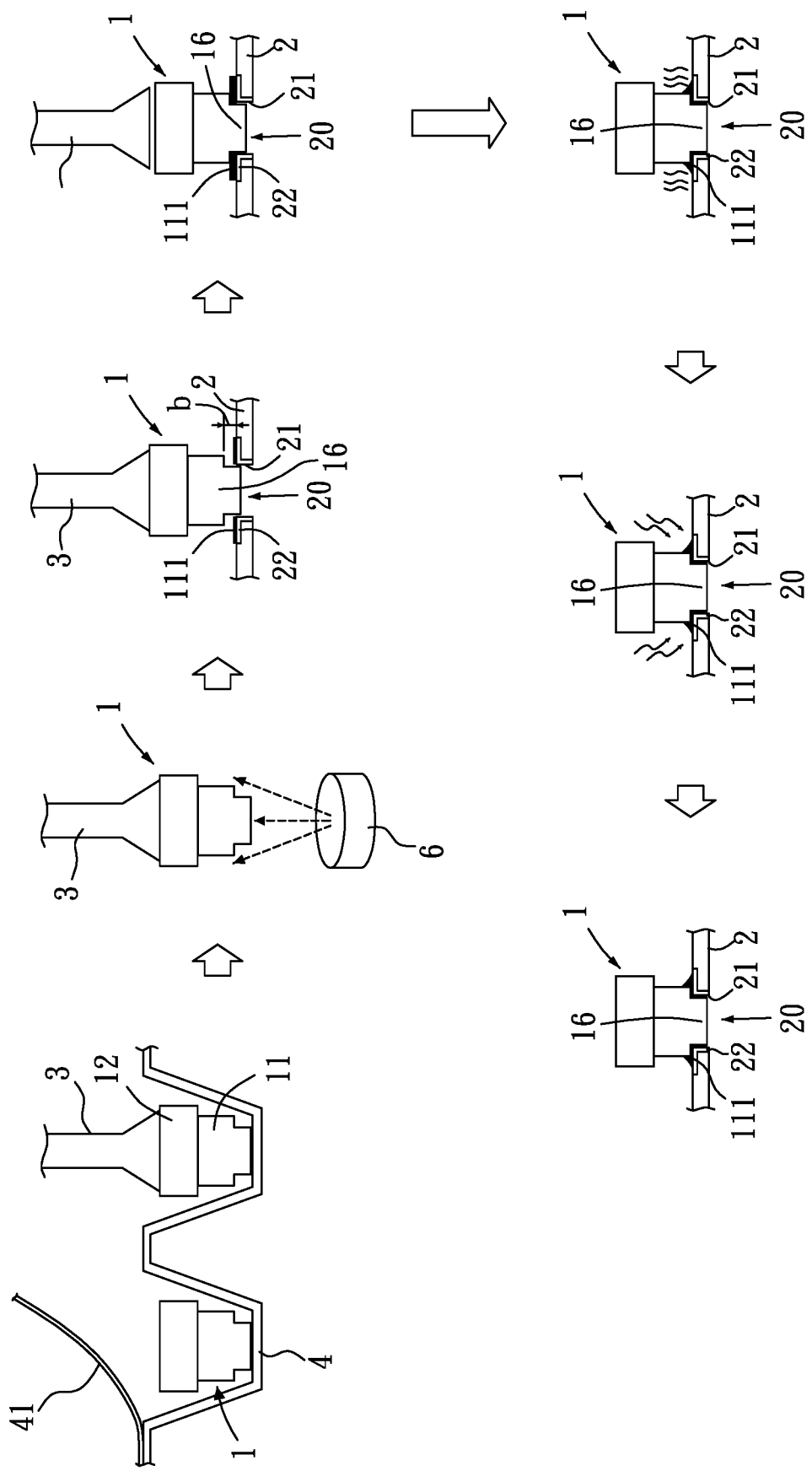
FIG. 23 is a schematic view 1 of state of use illustrating a fastener structure according to the sixteenth embodiment of the present disclosure.
Figure 24:
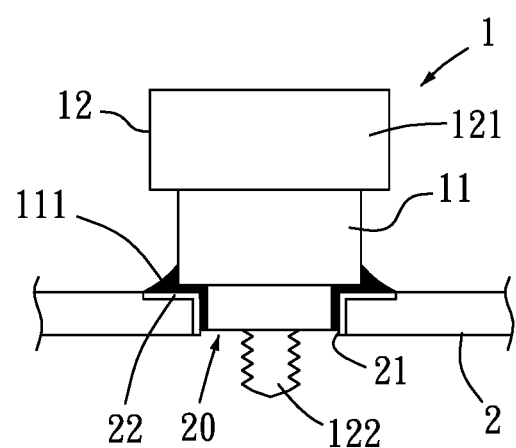
FIG. 24 is a schematic view 2 of state of use illustrating a fastener structure according to the sixteenth embodiment of the present disclosure.

Referring to FIGS. 23-24, as shown in the drawings, the fastener structure 1 may be provided in a carrier 4, and after the fastener structure 1 is picked up from the carrier 4 by a tool 3, a position or distance of the fastener structure 1 to a corresponding solderable layer 22 on an assembly position 20 of the plate body 2 is matched through a matching device 6 so that the tool 3 moves the fastener structure 1 to a preset height b (which can be 0.000001 mm to 10 mm) over the corresponding solderable layer 22 of the plate body 2 according to matching information of the matching device 6, and then the fastener structure 1 is loosened or released to make the fastener structure 1 fall to the corresponding solderable layer 22 on the assembly position 20 of the plate body 2 in the embodiment. Next, a solderable layer 111 of the fastener structure 1 and the corresponding solderable layer 22 of the plate body 2 are heated and soldered so that the fastener structure 1 is soldered to the plate body 2, wherein the plate body 2 may be a PCB, and the assembly position 20 of the plate body 2 may have an opening 21, and a combination portion 16 of a body portion 11 of the fastener structure 1 may be provided in the opening 21.

Figure 25:
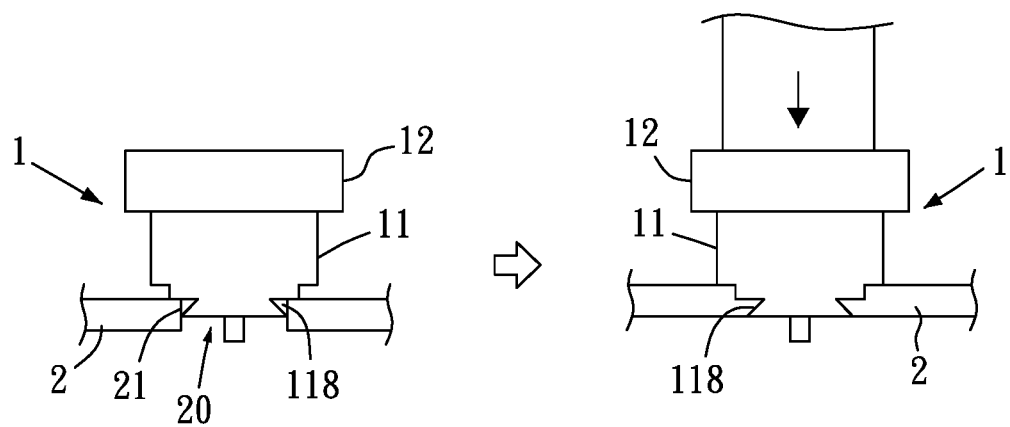
FIG. 25 is a schematic view of state of use illustrating a fastener structure according to the seventeenth embodiment of the present disclosure.

Referring to FIG. 25, as shown in the drawing, the bottom of the body portion 11 of the fastener structure 1 may have a stock accommodating space 118 in an embodiment of the invention, and after the stock accommodating space 118 of the fastener structure 1 falls to the opening 21 of the plate body 2, the fastener structure 1 can be pressed by an external force with a mold, the body portion 11 will press around the opening 21 so that the material of the plate body 2 flows into or enters the stock accommodating space 118 to make the fastener structure 1 assembled in the plate body 2.

Figure 26:
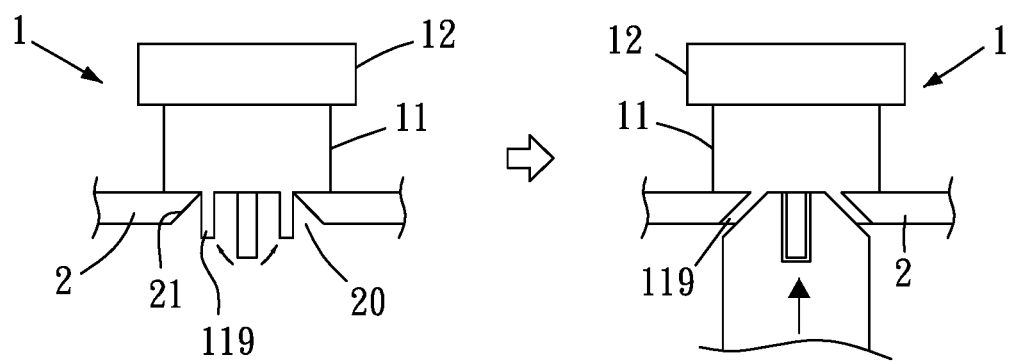
FIG. 26 is a schematic view of state of use illustrating a fastener structure according to the eighteenth embodiment of the present disclosure.

Referring to FIG. 26, as shown in the drawing, the bottom of the body portion 11 of the fastener structure 1 may have an expansion joint 119 in an embodiment of the invention, and after the expansion joint 119 of the fastener structure 1 falls to the opening 21 of the plate body 2, the expansion joint 119 can be pressed by an external force with a mold to deform the expansion joint 119 outward for connecting around the opening 21 so that the fastener structure 1 is assembled in the plate body 2.

Figure 27A:
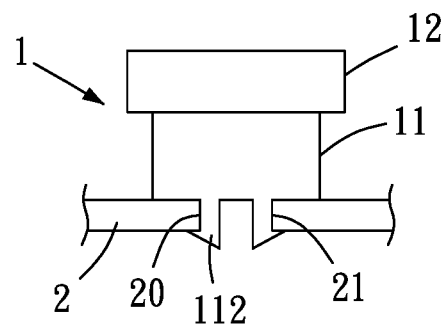
FIG. 27A is a schematic view 1 of state of use illustrating a fastener structure according to the nineteenth embodiment of the present disclosure.

Referring to FIG. 27A, as shown in the drawing, the bottom of the body portion 11 of the fastener structure 1 may have a fastening joint 112 in an embodiment of the invention, and after the fastening joint 112 of the fastener structure 1 falls to the opening 21 of the plate body 2, the fastening joint 112 can fasten around the opening 21 so that the fastener structure 1 is assembled in the plate body 2.

Figure 27B:
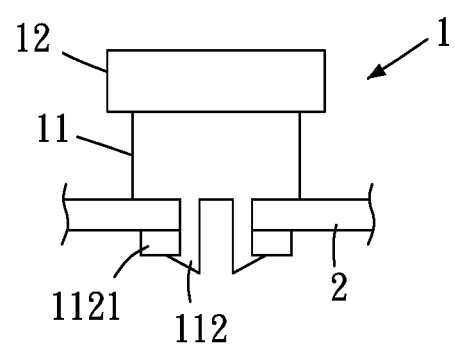
FIG. 27B is a schematic view 2 of state of use illustrating a fastener structure according to the nineteenth embodiment of the present disclosure.

Referring to FIG. 27B, as shown in the drawing, after the fastening joint 112 of the fastener structure 1 falls to the opening 21 of the plate body 2, the fastening joint 112 can fasten a fastening body 1121, and then provided around the opening 21 in an embodiment of the invention.

Figure 28A:
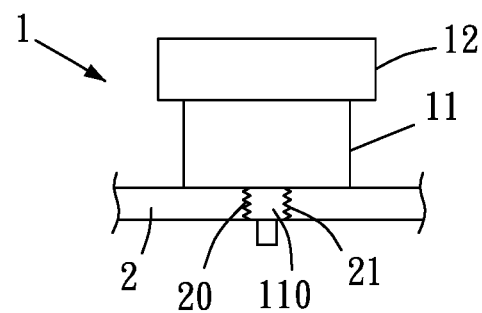
FIG. 28A is a schematic view 1 of state of use illustrating a fastener structure according to the twentieth embodiment of the present disclosure.

Referring to FIG. 28A, as shown in the drawing, the bottom of the body portion 11 of the fastener structure 1 may have a locking joint 110 in an embodiment of the invention, and after the locking joint 110 of the fastener structure 1 falls to the opening 21 of the plate body 2, the locking joint 110 can lock around the opening 21 so that the fastener structure 1 is assembled in the plate body 2.

Figure 28B:
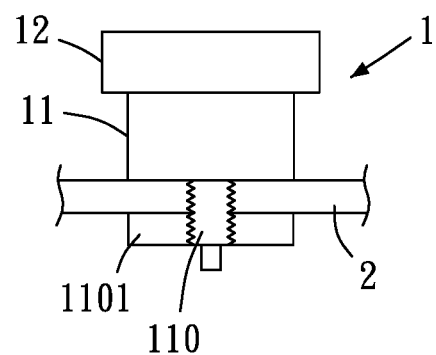
FIG. 28B is a schematic view 2 of state of use illustrating a fastener structure according to the twentieth embodiment of the present disclosure.

Referring to FIG. 28B, as shown in the drawing, after the locking joint 110 of the fastener structure 1 falls to the opening 21 of the plate body 2, the locking joint 110 can lock a locking body 1101, and then provided around the opening 21 in an embodiment of the invention.

In an embodiment of the invention, the tool 3 may be a vacuum extracting device, fixture, fastening body, magnetic device or robotic arm. Accordingly, the tool 3 can meet the requirement of practically picking up the fastener structure 1.

In an embodiment of the invention, the solderable layer 111 or the corresponding solderable layer 22 may be a layer of tin, copper, nickel or zinc. Accordingly, the solderable layer 111 and the corresponding solderable layer 22 can meet the requirement of practically soldering the fastener structure 1 and the plate body 2.

In an embodiment of the invention, the solderable layer 111 or the corresponding solderable layer 22 may be a copper plating layer, and a tin plating layer (a solderable layer) may be provided on the copper plating layer. Accordingly, the solderable layer 111 and the corresponding solderable layer 22 can meet the requirement of practically soldering the fastener structure 1 and the plate body 2.

In an embodiment of the invention, the matching device 6 may be a visual matching device, a distance matching device, a charge coupled device (CCD) or an image matching device. Accordingly, the matching device 6 can meet the requirement of practically soldering the fastener structure 1 and the plate body 2.

While the present disclosure has been described by means of specific embodiments, numerous modifications and variations could be made thereto by those skilled in the art without departing from the scope and spirit of the present disclosure set forth in the claims.

What is claimed is:

1. A method of assembling a fastener structure on a plate body, in which the fastener structure has a body portion and a fastening body, the fastening body combines movably with the body portion, and the fastening body has a head and a fastening portion, the method comprises the following steps:
providing a tool to pick up the fastener structure;
using the tool to move the fastener structure to a preset height over an assembly position of the plate body; and
loosening or releasing the fastener structure from the tool to make the fastener structure fall to the assembly position of the plate body.

2. The method according to claim 1, further comprising the following steps: providing a matching device to match an assembly position or an assembly distance of the fastener structure to the plate body after the tool picking up the fastener structure; using the tool to move the fastener structure to a preset height over the assembly position of the plate body according to matching information of the matching device; and loosening or releasing the fastener structure from the tool to make the fastener structure fall to the assembly position of the plate body.

3. The method according to claim 2, wherein the matching device is a visual matching device, a distance matching device, a charge coupled device (CCD) or an image matching device.

4. The method according to claim 1, further comprising the following steps: providing a matching device to match a position or distance of the fastener structure to a corresponding solderable layer on the assembly position of the plate body after the tool picking up the fastener structure; using the tool to move the fastener structure to a preset height over the corresponding solderable layer of the plate body according to matching information of the matching device; and loosening or releasing the fastener structure from the tool to make the fastener structure fall to the corresponding solderable layer of the plate body.

5. The method according to claim 4, wherein the corresponding solderable layer is a layer of tin, copper, nickel or zinc.

6. The method according to claim 4, wherein the corresponding solderable layer is a copper plating layer, and a tin plating layer is provided on the copper plating layer.

7. The method according to claim 4, wherein the matching device is a visual matching device, a distance matching device, a charge coupled device (CCD) or an image matching device.

8. The method according to claim 1, wherein the body portion has a solderable layer, the plate body is a PCB, and the plate body has a corresponding solderable layer, the method further comprises the following steps: providing a matching device to match a position or distance of the fastener structure to the corresponding solderable layer on the assembly position of the plate body after the tool picking up the fastener structure; using the tool to move the fastener structure to a preset height over the corresponding solderable layer of the plate body according to matching information of the matching device; loosening or releasing the fastener structure from the tool to make the fastener structure fall to the corresponding solderable layer of the plate body; and heating and soldering the solderable layer of the fastener structure and the corresponding solderable layer of the plate body.

9. The method according to claim 8, wherein the corresponding solderable layer is a layer of tin, copper, nickel or zinc.

10. The method according to claim 8, wherein the solderable layer is a layer of tin, copper, nickel or zinc.

11. The method according to claim 8, wherein the corresponding solderable layer is a copper plating layer, and a tin plating layer is provided on the copper plating layer.

12. The method according to claim 8, wherein the solderable layer is a copper plating layer, and a tin plating layer is provided on the copper plating layer.

13. The method according to claim 8, wherein the matching device is a visual matching device, a distance matching device, a charge coupled device (CCD) or an image matching device.

14. The method according to claim 1, wherein the body portion of the fastener structure has a stock accommodating space, and the assembly position of the plate body has an opening, after the stock accommodating space of the fastener structure falls to the opening of the plate body, the fastener structure can be pressed by an external force, the body portion will press around the opening so that the material of the plate body flows into or enters the stock accommodating space.

15. The method according to claim 1, wherein the body portion of the fastener structure has an expansion joint, and the assembly position of the plate body has an opening, after the expansion joint of the fastener structure falls to the opening of the plate body, the expansion joint can be pressed by an external force to deform the expansion joint for connecting around the opening.

16. The method according to claim 1, wherein the body portion of the fastener structure has a fastening joint, and the assembly position of the plate body has an opening, after the fastening joint of the fastener structure falls to the opening of the plate body, the fastening joint fastens around the opening.

17. The method according to claim 16, wherein the fastening joint fastens a fastening body, and then provided around the opening.

18. The method according to claim 1, wherein the body portion of the fastener structure has a locking joint, and the assembly position of the plate body has an opening, after the locking joint of the fastener structure falls to the opening of the plate body, the locking joint locks around the opening.

19. The method according to claim 18, wherein the locking joint locks a locking body, and then provided around the opening.

20. The method according to claim 1, wherein the tool is a vacuum extracting device, fixture, fastening body, magnetic device or robotic arm.

21. The method according to claim 1, wherein the fastener structure is picked up from a carrier by the tool.

22. The method according to claim 1, wherein the preset height is 0.000001 mm to 10 mm.

23. A method of assembling a fastener structure on a plate body, in which the fastener structure has a body portion and a fastening body, the body portion provided with a solderable layer, and the solderable layer is used to be soldered to a plate body for another plate body can be provided on the body portion, the fastening body combines movably with the body portion, and the fastening body has a head and a fastening portion, the solderable layer is on the same side as the head with respect to the body portion, the head is closer to the plate body than the fastening portion, the fastening portion combine with the another plate body, so that the plate body can combine with the another plate body by the fastener structure, and the body portion and the another plate body are located on the same side of the plate body;
the method comprises the following steps:
providing a tool to pick up the fastener structure;
using the tool to move the fastener structure to a preset height over an assembly position of the plate body; and
loosening or releasing the fastener structure from the tool to make the fastener structure fall to the assembly position of the plate body.

24. A method of assembling a fastener structure on a plate body, in which the fastener structure has a body portion and a fastening body, the fastening body combines movably with the body portion, and the fastening body has a head and a fastening portion, the method comprises the following steps:
providing a tool to pick up the fastener structure;
using the tool to move the fastener structure to a preset height over an assembly position of the plate body; and
loosening or releasing the fastener structure from the tool to make the fastener structure fall to the assembly position of the plate body;
wherein the body portion or the fastening body, or both the body portion and the fastening body combine(s) with an assisting pickup unit, and the fastener structure is provided on the plate body for soldering after it is picked up by the tool through the assisting pickup unit so that the body portion can combine with the plate body.

25. A method of assembling a fastener structure on a plate body, in which the fastener structure has a body portion and a fastening body, the fastening body combines movably with the body portion, and the fastening body has a head and a fastening portion, the method comprises the following steps:
providing a tool to pick up the fastener structure;
using the tool to move the fastener structure to a preset height over an assembly position of the plate body; and
loosening or releasing the fastener structure from the tool to make the fastener structure fall to the assembly position of the plate body;
wherein the body portion or the fastening body, or both the body portion and the fastening body combine(s) with an assisting pickup unit, and the fastener structure is provided on the plate body for soldering after it is picked up by the tool through the assisting pickup unit so that the body portion can combine with the plate body;
wherein the body portion has a stuck portion, and the assisting pickup unit has a corresponding stuck portion, and the corresponding stuck portion removably fits to the stuck portion each other.

26. A method of assembling a fastener structure on a plate body, in which the fastener structure has a body portion and a fastening body, the fastening body combines movably with the body portion, and the fastening body has a head and a fastening portion, the method comprises the following steps:
providing a tool to pick up the fastener structure;
using the tool to move the fastener structure to a preset height over an assembly position of the plate body; and
loosening or releasing the fastener structure from the tool to make the fastener structure fall to the assembly position of the plate body;
wherein the body portion or the fastening body, or both the body portion and the fastening body combine(s) with an assisting pickup unit, and the fastener structure is provided on the plate body for soldering after it is picked up by the tool through the assisting pickup unit so that the body portion can combine with the plate body;

wherein the body portion has an assisting mounting portion for entering the body portion into an opening of the plate body, or for combining the assisting pickup unit with the body portion, the assisting mounting portion is a bevel body.

27. A method of assembling a fastener structure on a plate body, in which the fastener structure has a body portion and a fastening body, the fastening body combines movably with the body portion, and the fastening body has a head and a fastening portion, the method comprises the following steps:
providing a tool to pick up the fastener structure;
using the tool to move the fastener structure to a preset height over an assembly position of the plate body; and
loosening or releasing the fastener structure from the tool to make the fastener structure fall to the assembly position of the plate body;
wherein the body portion have an end which is located away from the head, and the body portion is provided on the plate body for soldering after it is picked up by the tool through the end so that the body portion combines with the plate body;
wherein when the fastener structure is picked up by the tool, a device is provided correspondingly or in a corresponding direction in front of placing the fastener structure, and the device is used to calculate the relative position of the body portion or the fastening body with the plate body or an opening of the plate body, or the relative position of the body portion and the fastening body with the plate body or an opening of the plate body, or the relative position of the assisting pickup unit with the plate body or an opening of the plate body to precisely place the fastener structure on the plate body or the opening of the plate body.

28. A method of assembling a fastener structure on a plate body, in which the fastener structure has a body portion and a fastening body, the fastening body combines movably with the body portion, and the fastening body has a head and a fastening portion, the method comprises the following steps:
providing a tool to pick up the fastener structure;
using the tool to move the fastener structure to a preset height over an assembly position of the plate body; and
loosening or releasing the fastener structure from the tool to make the fastener structure fall to the assembly position of the plate body;
wherein the body portion or the fastening body, or both the body portion and the fastening body is (are) provided on the plate body for soldering after it is (they are) picked up by the tool so that the body portion combines with the plate body;
wherein when the fastener structure is picked up by the tool, a device is provided correspondingly or in a corresponding direction in front of placing the fastener structure, and the device is used to calculate the relative position of the body portion or the fastening body with the plate body or an opening of the plate body, or the relative position of the body portion and the fastening body with the plate body or an opening of the plate body.

29. A method of assembling a fastener structure on a plate body, in which the fastener structure has a body portion and a fastening body, the fastening body combines movably with the body portion, and the fastening body has a head and a fastening portion, the method comprises the following steps:
providing a tool to pick up the fastener structure;
using the tool to move the fastener structure to a preset height over an assembly position of the plate body; and
loosening or releasing the fastener structure from the tool to make the fastener structure fall to the assembly position of the plate body;
wherein the body portion or the fastening body, or both the body portion and the fastening body combine(s) with an assisting pickup unit, and the fastener structure is provided on the plate body for soldering after it is picked up by the tool through the assisting pickup unit so that the body portion combines with the plate body;
wherein when the fastener structure is picked up by the tool, a device is provided correspondingly or in a corresponding direction in front of placing the fastener structure, and the device is used to calculate the relative position of the body portion or the fastening body with the plate body or an opening of the plate body, or the relative position of the body portion and the fastening body with the plate body or an opening of the plate body, or the relative position of the assisting pickup unit with the plate body or an opening of the plate body to precisely place the fastener structure on the plate body or the opening of the plate body.

* * * * *